United States Patent
Pan

(10) Patent No.: US 7,088,193 B2
(45) Date of Patent: Aug. 8, 2006

(54) FAST STARTING ON-CHIP CRYSTAL OSCILLATION CIRCUIT

(75) Inventor: Meng-An (Michael) Pan, Cerritos, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/140,779

(22) Filed: May 31, 2005

(65) Prior Publication Data

US 2005/0219004 A1    Oct. 6, 2005

Related U.S. Application Data

(62) Division of application No. 10/459,929, filed on Jun. 12, 2003.

(51) Int. Cl.
*H03B 5/32* (2006.01)
(52) U.S. Cl. ............................. 331/116 FE; 331/158; 327/143
(58) Field of Classification Search ............... 331/158, 331/116 FE; 327/143
See application file for complete search history.

(56) References Cited

U.S. PATENT DOCUMENTS

| 5,805,027 A | * | 9/1998 | Yin | 331/116 FE |
| 6,160,457 A | * | 12/2000 | Wu | 331/116 FE |
| 6,329,884 B1 | * | 12/2001 | Tsukagoshi et al. | 331/116 FE |
| 6,703,905 B1 | * | 3/2004 | Sekimoto | 331/116 FE |

* cited by examiner

*Primary Examiner*—Joseph Chang
(74) *Attorney, Agent, or Firm*—Garlick Harrison & Markison; Timothy W. Markison

(57) ABSTRACT

A fast starting on-chip crystal oscillation circuit includes a ($V_{dd}$) IC pad, a ($V_{ss}$) IC pad, a $1^{st}$ crystal IC pad, a $2^{nd}$ crystal IC pad, a $1^{st}$ transistor, a $2^{nd}$ transistor, an inverter, a resistor, and two capacitors. The $1^{st}$ and $2^{nd}$ crystal IC pads couple an external crystal oscillator to the fast starting on-chip crystal oscillation circuit. The $1^{st}$ and $2^{nd}$ transistors, when activated, couple power to the inverter. The input of the inverter is coupled to the $1^{st}$ crystal IC pad and to the $1^{st}$ capacitor. The output of the inverter is coupled to the $2^{nd}$ crystal IC pad and to the $2^{nd}$ capacitor. The resistor is coupled in parallel with the inverter. When the $1^{st}$ and $2^{nd}$ transistors are activated, an impulse voltage occurs between the $1^{st}$ and $2^{nd}$ crystal IC pads to initiate the oscillation of the crystal oscillator.

8 Claims, 5 Drawing Sheets fast starting on-chip crystal oscillation circuit 10

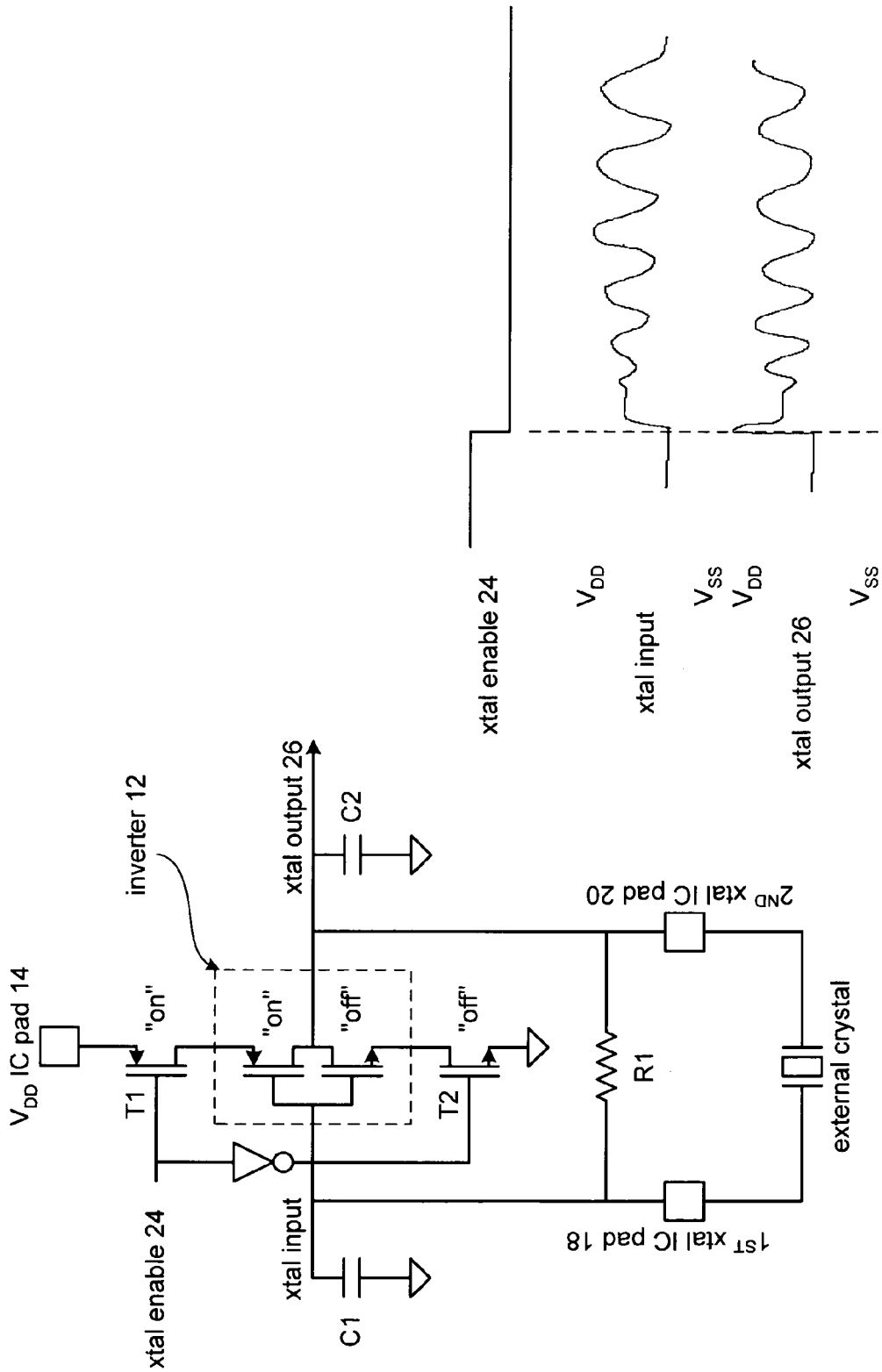

fast starting on-chip crystal oscillation circuit 40

PLL 60 radio 80

FAST STARTING ON-CHIP CRYSTAL OSCILLATION CIRCUIT

This patent application is claiming priority under 35 USC § 121 as a divisional patent application of patent application entitled FAST STARTING ON-CHIP CRYSTAL OSCILLATION CIRCUIT, having a Ser. No. of 10/459,929, and a filing date of Jun. 12, 2003.

BACKGROUND OF THE INVENTION

1. Technical Field of the Invention

This invention relates generally to integrated circuits and more particularly to crystal oscillation circuits used therein.

2. Description of Related Art

As is known, all integrated circuits that include a processor component (e.g., a processor, a digital signal processor, a state machine, et cetera) require at least one clock signal. For high-tech integrated circuits, such as those used in wireless communication devices, the clock signal may have a rate in the hundreds of megahertz to tens of gigahertz. To produce such a high frequency clock signal, most processor based integrated circuits include a phase locked loop and/or a variation thereof (e.g., a fractional-N synthesizer).

As is also known, a phase locked loop includes a phase and frequency detector, a charge pump, a loop filter, a voltage controlled oscillator, and a feedback divider. In operation, the phase and frequency detector compares the phase and/or frequency of a reference clock signal with the phase and/or frequency of the feedback clock signal (i.e., the desired high frequency clock signal divided by the feedback divider). If a phase and/or frequency difference exists, the phase and frequency detector generates an up signal or a down signal. The phase and frequency detector generates the up signal when the phase and/or frequency leads the phase and/or frequency of the feedback clock signal, which indicates that the rate of the desired high frequency clock is too slow. Conversely, the phase and frequency detector generates the down signal when the rate of the desired high frequency clock signal is too fast.

The charge pump converts the up or down signal into a current signal. The loop filter converts the current signal into a control voltage. The voltage control oscillator produces the desired high frequency clock signal based on the control voltage.

As is generally understood in the art, the reference clock signal needs to be stable for the phase locked loop to function properly. Typically, the reference clock signal is produced by a crystal oscillation circuit that includes a crystal oscillator, an inverter coupled in parallel with the crystal oscillator, and capacitors coupled to the input and output of the inverter and to ground. To conserve power, the crystal oscillation circuit includes an enable/disable mechanism. For example, the positive supply voltage connection of the inverter may be coupled to a power enable transistor that, when enabled, couples the positive supply voltage connection of the inverter to the power supply of the integrated circuit. Once enabled, thermal noise activates the oscillation of the crystal oscillation circuit.

To speed up the activation of the crystal oscillation circuit, the circuit may include an activation circuit that places the input and output of the inverter in known states at the activation of the crystal oscillation circuit. While such activation circuits work well, they consume integrated circuit die area, which, for the never ending quest for smaller die areas, is counter productive.

Therefore, a need exists for a crystal oscillation circuit with active start-up that requires minimal additional circuitry.

BRIEF SUMMARY OF THE INVENTION

The fast starting on-chip crystal oscillation circuit of the present invention substantially meets these needs and others. In one embodiment, the fast starting on-chip crystal oscillation circuit includes a power supply ($V_{dd}$) integrated circuit pad, a power return ($V_{ss}$) integrated circuit pad, a $1^{st}$ crystal integrated circuit pad, a $2^{nd}$ crystal integrated circuit pad, a $1^{st}$ transistor, a $2^{nd}$ transistor, an inverter, a resistor, and two capacitors. The $1^{st}$ and $2^{nd}$ crystal IC pads couple a $1^{st}$ and $2^{nd}$ node of an external crystal oscillator to the fast starting on-chip crystal oscillation circuit. The $1^{st}$ transistor, when activated, couples a power source connection of the inverter to the $V_{dd}$ IC pad. The $2^{nd}$ transistor, when activated, couples a power return connection of the inverter to the $V_{ss}$ IC pad. The input of the inverter is coupled to the $1^{st}$ crystal IC pad and the output of the inverter is coupled to the $2^{nd}$ crystal IC pad. The resistor is coupled in parallel with the inverter while the $1^{st}$ capacitor is coupled to the input of the inverter and to the $V_{ss}$ IC pad. The $2^{nd}$ capacitor is coupled to the output of the inverter and to the $V_{ss}$ IC pad. When the $1^{st}$ and $2^{nd}$ transistors are activated, an impulse voltage occurs between the $1^{st}$ and $2^{nd}$ crystal IC pads to initiate the oscillation of the crystal oscillator. As such, the crystal oscillation is activated via the impulse, as opposed to thermal noise, which speeds up the activation of the reference clock with a minimal amount of additional circuitry.

In another embodiment, a fast starting on-chip crystal oscillation circuit includes a $V_{DD}$ integrated circuit (IC) pad, a $V_{SS}$ IC pad; a first crystal IC pad for coupling to a first node of an external crystal oscillator, a second crystal IC pad for coupling to a second node of the external crystal oscillator; a first transistor, an inverter, a resistor, and two capacitors. The first transistor includes a gate, a drain, and a source, wherein the source of the first transistor is operably coupled to the $V_{SS}$ IC pad and wherein the gate of the first transistor is operably coupled to receive a crystal enable signal. The inverter includes an input, an output, a power source connection, and a power return connection, wherein the input of the inverter is operably coupled to the first crystal IC pad, wherein the output of the inverter is operably coupled to the second crystal IC pad, wherein the power source connection is operably coupled to the $V_{DD}$ IC pad, and wherein the power return connection is operably coupled to the drain of the first transistor. The resistor is operably coupled to the input and the output of the inverter. The first capacitor operably coupled to the input of the inverter and the second capacitor operably coupled to the output of the inverter.

In yet another embodiment, a fast starting on-chip crystal oscillation circuit includes a $V_{DD}$ integrated circuit (IC) pad, a $V_{SS}$ IC pad, a first crystal IC pad for coupling to a first node of an external crystal oscillator, a second crystal IC pad for coupling to a second node of the external crystal oscillator, a first transistor, a second transistor, a third transistor, an inverter, a resistor, and two capacitors. The first transistor includes a gate, a drain, and a source, wherein the drain of the first transistor is operably coupled to the $V_{DD}$ IC pad and wherein the gate of the first transistor is operably coupled to receive a crystal enable signal. The second transistor includes a gate, a drain, and a source, wherein the source of the second transistor is operably coupled to the $V_{SS}$ IC pad and wherein the gate of the second transistor is operably coupled to the source of the first transistor. The third transistor includes a gate, a drain, and a source, wherein the gate of the third transistor is operably coupled to the drain of the second transistor and wherein the drain of the third transistor is operably coupled to the $V_{DD}$ IC pad. The inverter includes an input, an output, a power source connection, and a power return connection, wherein the input of the inverter is operably coupled to the first crystal IC pad, wherein the output of the inverter is operably coupled to the second crystal IC pad, wherein the power source connection is operably coupled to the source of the third transistor and wherein the power return connection is operably coupled to the $V_{SS}$ IC pad. The resistor is operably coupled to the input and the output of the inverter. The first capacitor is operably coupled to the input of the inverter and the second capacitor is operably coupled to the output of the inverter.

BRIEF DESCRIPTION OF THE SEVERAL VIEWS OF THE DRAWINGS

FIG. 2 is a schematic block diagram of a fast starting on-chip crystal oscillation circuit at enablement in accordance with the present invention;

FIG. 3 is a timing diagram of the fast starting on-chip crystal oscillation circuit of FIG. 2;

DETAILED DESCRIPTION OF THE INVENTION

Figure 1:
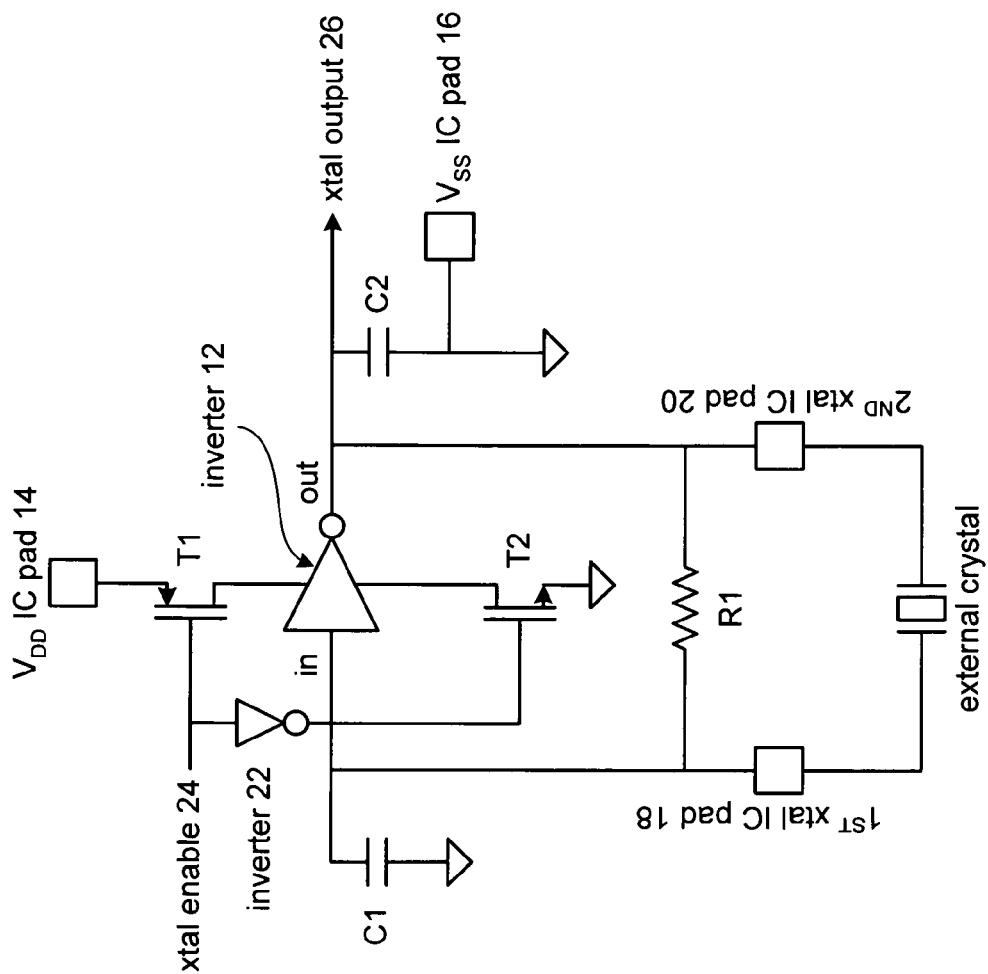
FIG. 1 is a schematic block diagram of a fast starting on-chip crystal oscillation circuit in accordance with the present invention.

FIG. 1 is a schematic block diagram of a fast starting on-chip crystal oscillation circuit 10 that includes an inverter 12, transistors T1 and T2, capacitors C1 and C2, a power supply integrated circuit pad 14 ($V_{dd}$ IC), a power supply return integrated circuit pad 16 ($V_{ss}$ IC), and 2 crystal oscillation pads 18 and 20 (XTL IC), a second inverter 22, and a resistor R1. As shown, an external crystal is coupled to the $1^{st}$ and $2^{nd}$ crystal integrated circuit pads 18.

In operation, the fast starting on-chip crystal oscillation circuit 10 is enabled via a crystal enable signal 24. When the enable signal 24 transitions from a logic-high to a logic-low, transistors T1 and T2 are enabled which applies an impulse across the external crystal to achieve a fast starting oscillation of the oscillating circuit. Once the oscillation circuit 10 is enabled, the inverter input and output will continuously toggle at a particular rate based on the external crystal, the size of resistor R1 and the size of capacitors C1 and C2. For example, the crystal output 26 may be in the range of 10 megahertz to 25 megahertz. As one of average skill in the art will appreciate, capacitors C1 and C2 may be coupled to the drain of transistor T2 as opposed to the $V_{ss}$ IC pad 16.

FIG. 2 is a schematic block diagram of the fast starting on-chip crystal oscillation circuit 10 when the crystal enable signal 24 is first activated. The illustration of FIG. 2 further depicts inverter 12 as including a P-channel transistor and an N-channel transistor. At the point of enablement, transistor T1 is turned on as is the P-channel transistor within the inverter 12. Also at enablement, the N-channel transistor of inverter 12 is off as is transistor T2. In this instance, an impulse is provided across the $1^{st}$ and $2^{nd}$ crystal IC pads 18 and 20 as shown in the timing diagram of FIG. 3.

As shown in FIG. 3, when the crystal enable signal 24 transitions low, the crystal output 26 rapidly ramps-up from $V_{ss}$ to $V_{dd}$ while the crystal input changes to a nominal value, which provides the fast starting of the oscillation. Once the crystal output 26 reaches a threshold voltage, the output begins to transition low and the input begins to transition high as shown. Over the next few cycles, the magnitude of the oscillation reaches a more steady-state condition.

Figure 4:
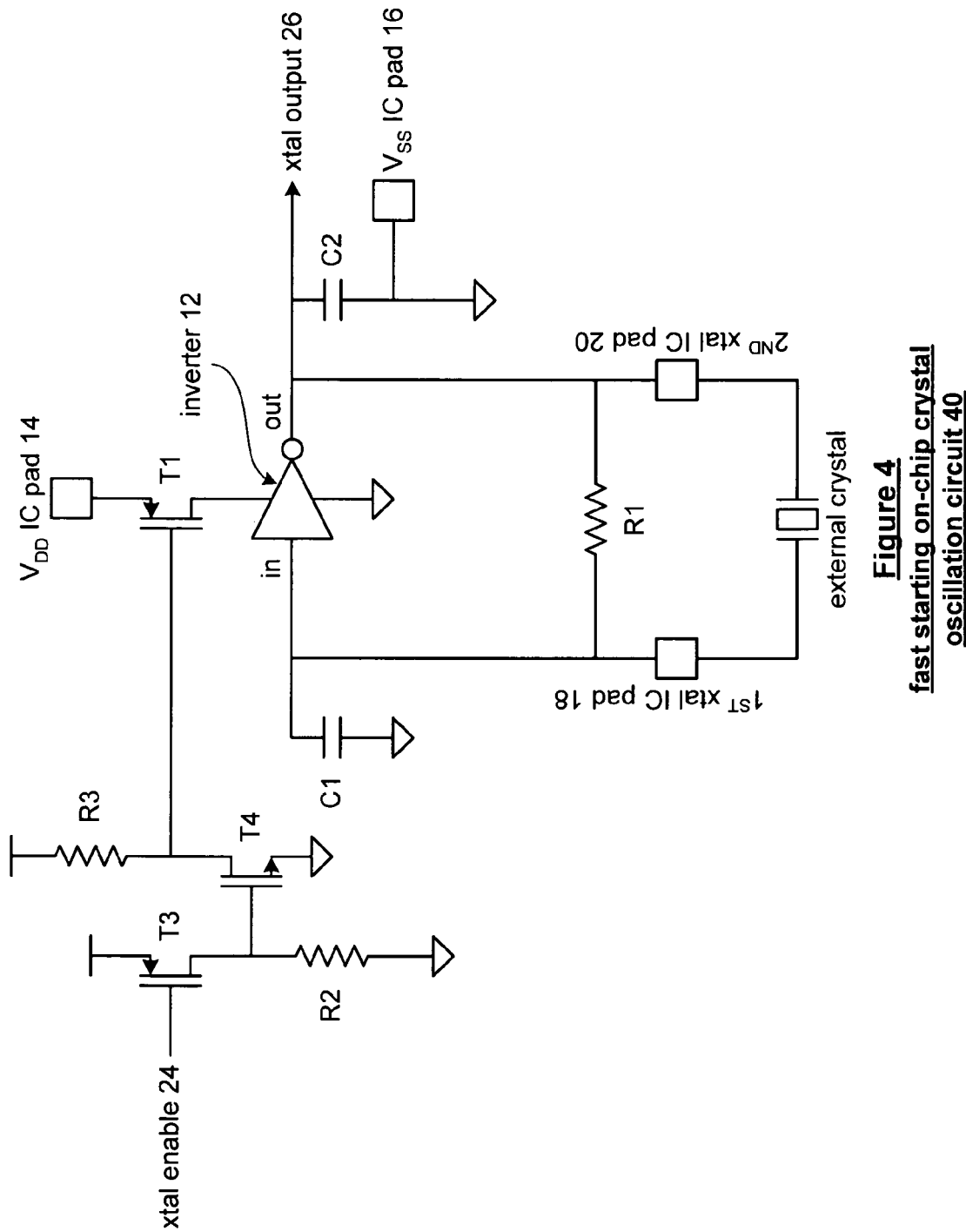
FIG. 4 is a schematic block diagram of another embodiment of a fast starting on-chip crystal oscillation circuit in accordance with the present invention.

FIG. 4 is a schematic block diagram of an alternate embodiment of a fast starting on-chip crystal oscillation circuit 40. In this embodiment, the inverter 12 is enabled via transistor T1, which is a P-channel transistor. The circuit also includes transistors T3 and T4, and pull up and pull down resistors R2 and R3 to provide the gating for transistor T1. As with the circuit of FIG. 2, when transistor T1 is activated an impulse occurs across the crystal IC pads 18 and 20 to pull the output of inverter 12 high while maintaining the input of inverter 12 low to provide a fast starting of the oscillation.

Figure 5:
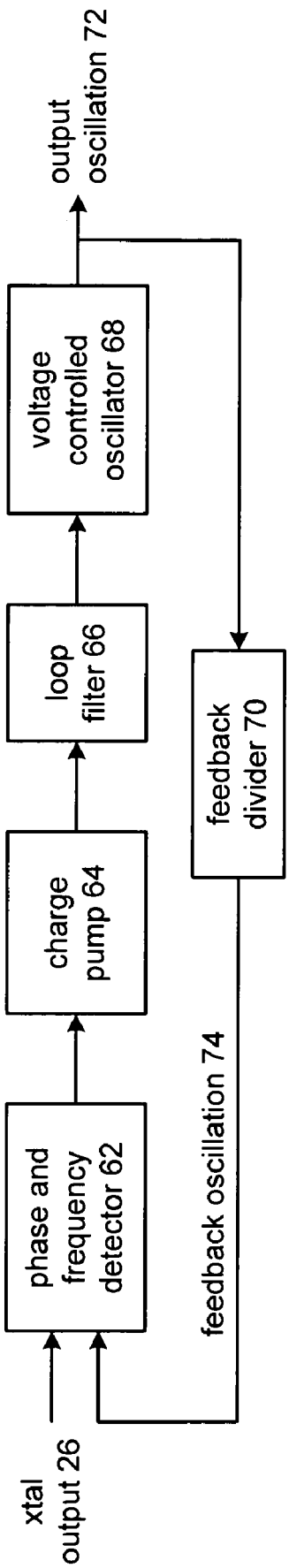
FIG. 5 is a schematic block diagram of a phase locked loop that may include a fast starting on-chip crystal oscillation circuit of FIGS. 1–4.

FIG. 5 is a schematic block diagram of a phase locked loop 60 that receives the crystal output 26 via a phase and frequency detector 62. The phase locked loop 60 also includes a charge pump 64, loop filter 66, voltage control oscillator 68 and feedback divider 70. The operation of the phase locked loop is known to compare the phase and/or frequency difference between the crystal output reference 26 and the feedback oscillation 74. The charge pump converts the difference signal into a current signal that is subsequently converted into a voltage control signal via the loop filter 66. The output oscillation 72 produced by the voltage control oscillator 68 is based on the control voltage signal. The feedback divider produces the feedback oscillation 74 by dividing the rate of the output oscillation 72 by a divider value. The divider value may be an integer or a positive whole number.

Figure 6:
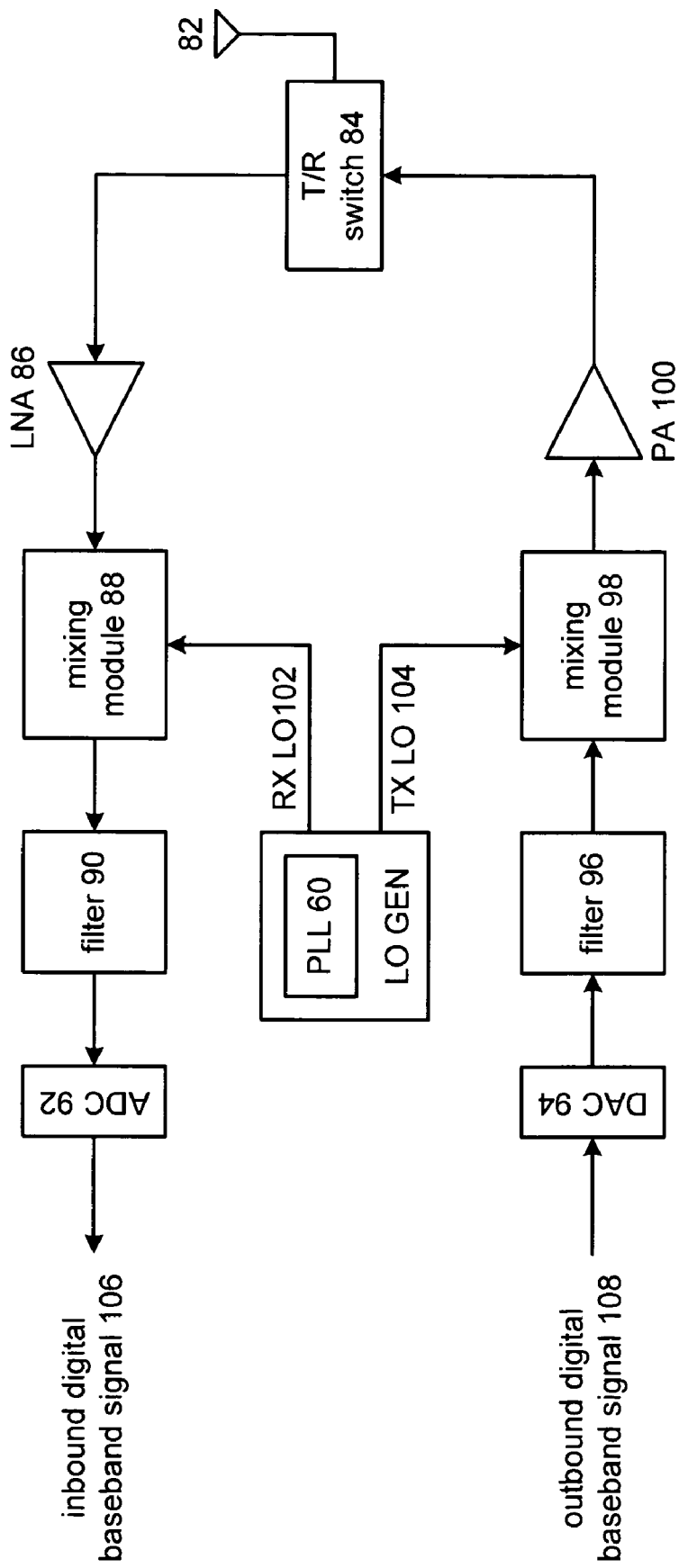
FIG. 6 is a schematic block diagram of a radio that may include the phase locked loop of FIG. 5.

FIG. 6 is a schematic block diagram of a radio 80 that includes an antenna 82, a transmit receive switch 84, a low noise amplifier 86, a mixing module 88, a filter 90 and an analog-to-digital converter 92, a digital-to-analog converter 94, a filter 96, a mixing module 98, a power amplifier 100 and a local oscillation generator that includes the phase locked loop 60 to produce a receiver local oscillation 102 and a transmit local oscillation 104. In operation, inbound RF signals are received via antenna 82 and provided to the low noise amplifier 86 via the TR switch 84. The mixing module 88 mixes the output of the low noise amplifier 86 with the receiver local oscillation 102 to produce a baseband or low intermediate frequency signal. Filter 90 filters the low, or baseband signal, which is provided to the analog-to-digital converter 92 to produce inbound digital baseband signal 106. For RF transmissions, the digital-to-analog converter 94 converts outbound digital baseband signal 108 into an analog signal that is subsequently filtered via filter 96. Mixing module 98 mixes the analog baseband signal 108 with a transmit local oscillation 104 to produce an RF signal. The power amplifier 100 amplifies the RF signal which is subsequently radiated via antenna 82.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented various embodiments for a fast starting on-chip crystal oscillation circuit that requires minimal additional circuitry to rapidly activate a crystal oscillation circuit. As one of average skill in the art will appreciate, other embodiments may be derived from the teachings of the present invention without deviating from the scope of the claims.

What is claimed is:

1. A fast starting on-chip crystal oscillation circuit comprises:
 a $V_{DD}$ integrated circuit (IC) pad;
 a $V_{SS}$ IC pad;
 first crystal IC pad for coupling to a first node of an external crystal oscillator;
 second crystal IC pad for coupling to a second node of the external crystal oscillator;
 a first transistor having a gate, a drain, and a source, wherein the drain of the first transistor is operably coupled to the $V_{DD}$ IC pad and wherein the gate of the first transistor is operably coupled to receive a crystal enable signal;
 a second transistor having a gate, a drain, and a source, wherein the source of the second transistor is operably coupled to the $V_{SS}$ IC pad and wherein the gate of the second transistor is operably coupled to the source of the first transistor;
 a third transistor having a gate, a drain, and a source, wherein the gate of the third transistor is operably coupled to the drain of the second transistor and wherein the drain of the third transistor is operably coupled to the $V_{DD}$ IC pad;
 an inverter having an input, an output, a power source connection, and a power return connection, wherein the input of the inverter is operably coupled to the first crystal IC pad, wherein the output of the inverter is operably coupled to the second crystal IC pad, wherein the power source connection is operably coupled to the source of the third transistor and wherein the power return connection is operably coupled to the $V_{SS}$ IC pad;
 a resistor operably coupled to the input and the output of the inverter;
 a first capacitor operably coupled to the input of the inverter; and
 a second capacitor operably coupled to the output of the inverter.

2. The fast starting on-chip crystal oscillation circuit of claim 1, wherein the inverter further comprises:
 a fourth transistor having a gate, a drain, and a source, wherein the gate of the fourth transistor is coupled as the input of the inverter and the drain of the fourth transistor is coupled as the power supply connection; and
 a fifth transistor having a gate, a drain, and a source, wherein the gate of the fifth transistor is coupled as the input of the inverter, the source of the fifth transistor is coupled as the power return connection, and the drain of the fifth transistor is coupled to the source of the fourth transistor.

3. The fast starting on-chip crystal oscillation circuit of claim 1 further comprises:
 the first and second capacitors coupled to the $V_{SS}$ IC pad.

4. The fast starting on-chip crystal oscillation circuit of claim 1 further comprises:
 the first and second capacitors coupled to the drain of the second transistor.

5. A phase locked loop comprises:
 phase and frequency detector operably coupled to produce a difference signal based on a difference between phase and frequency of a feedback oscillation and a reference oscillation;
 charge pump operably coupled to convert the difference signal into a current signal;
 loop filter operably coupled to convert the current signal into a control voltage;
 voltage controlled oscillator operably coupled to produce an output oscillation based on the control voltage;
 feedback divider operably coupled to divide the output oscillation by a divider value to produce the feedback oscillation; and
 a fast starting on-chip crystal oscillation circuit to produce the reference oscillation, the fast starting on-chip crystal oscillation circuit includes:
  a $V_{DD}$ integrated circuit (IC) pad;
  a $V_{SS}$ IC pad;
  first crystal IC pad for coupling to a first node of an external crystal oscillator;
  second crystal IC pad for coupling to a second node of the external crystal oscillator;
  a first transistor having a gate, a drain, and a source, wherein the drain of the first transistor is operably coupled to the $V_{DD}$ IC pad and wherein the gate of the first transistor is operably coupled to receive a crystal enable signal;
  a second transistor having a gate, a drain, and a source, wherein the source of the second transistor is operably coupled to the $V_{SS}$ IC pad and wherein the gate of the second transistor is operably coupled to the source of the first transistor;
  a third transistor having a gate, a drain, and a source, wherein the gate of the third transistor is operably coupled to the drain of the second transistor and wherein the drain of the third transistor is operably coupled to the $V_{DD}$ IC pad;
  an inverter having an input, an output, a power source connection, and a power return connection, wherein the input of the inverter is operably coupled to the first crystal IC pad, wherein the output of the inverter is operably coupled to the second crystal IC pad and provide the reference oscillation, wherein the power source connection is operably coupled to the source of the third transistor and wherein the power return connection is operably coupled to the $V_{SS}$ IC pad;

a resistor operably coupled to the input and the output of the inverter;

a first capacitor operably coupled to the input of the inverter; and a second capacitor operably coupled to the output of the inverter.

6. The phase locked loop of claim 5, wherein the inverter further comprises:

a fourth transistor having a gate, a drain, and a source, wherein the gate of the fourth transistor is coupled as the input of the inverter and the drain of the fourth transistor is coupled as the power supply connection; and a fifth transistor having a gate, a drain, and a source, wherein the gate of the fifth transistor is coupled as the input of the inverter, the source of the fifth transistor is coupled as the power return connection, and the drain of the fifth transistor is coupled to the source of the fourth transistor.

7. The phase locked loop of claim 5, wherein the fast starting on-chip crystal oscillation circuit further comprises:

the first and second capacitors coupled to the $V_{SS}$ IC pad.

8. The phase locked loop of claim 5, wherein the fast starting on-chip crystal oscillation circuit further comprises:

the first and second capacitors coupled to the drain of the second transistor.

* * * * *